United States Patent
Yoshimoto et al.

(10) Patent No.: US 11,828,809 B2
(45) Date of Patent: Nov. 28, 2023

(54) STORAGE BATTERY MONITORING APPARATUS AND STORAGE BATTERY MONITORING METHOD

(71) Applicant: GS Yuasa International Ltd., Kyoto (JP)

(72) Inventors: Kenta Yoshimoto, Kyoto (JP); Shuichi Takemoto, Kyoto (JP); Hirokazu Ito, Kyoto (JP); Yuya Kihira, Kyoto (JP)

(73) Assignee: GS Yuasa International Ltd., Kyoto (JP)

( * ) Notice: Subject to any disclaimer, the term of this patent is extended or adjusted under 35 U.S.C. 154(b) by 198 days.

(21) Appl. No.: 17/433,185

(22) PCT Filed: Jul. 1, 2019

(86) PCT No.: PCT/JP2019/026004
§ 371 (c)(1),
(2) Date: Aug. 23, 2021

(87) PCT Pub. No.: WO2020/174712
PCT Pub. Date: Sep. 3, 2020

(65) Prior Publication Data
US 2022/0137140 A1 May 5, 2022

(30) Foreign Application Priority Data

Feb. 27, 2019 (JP) ................................. 2019-034335

(51) Int. Cl.
*G01R 31/371* (2019.01)
*G01R 31/385* (2019.01)
*G01R 31/382* (2019.01)

(52) U.S. Cl.
CPC ......... *G01R 31/371* (2019.01); *G01R 31/382* (2019.01); *G01R 31/385* (2019.01)

(58) Field of Classification Search
None
See application file for complete search history.

(56) References Cited

U.S. PATENT DOCUMENTS 9,726,763 B2 * 8/2017 Dempsey .............. H01M 10/48
2013/0149578 A1 6/2013 Uchida
(Continued)

FOREIGN PATENT DOCUMENTS

JP 2012-085491 A 4/2012
JP 2012-124141 A 6/2012
(Continued)

OTHER PUBLICATIONS

International Search Report (ISR)(PCT Form PCT/ISA/210), in PCT/JP2019/026004, dated Sep. 3, 2019.

*Primary Examiner* — Roy Y Yi
(74) *Attorney, Agent, or Firm* — McGinn I.P. Law Group, PLLC

(57) ABSTRACT

A storage battery monitoring apparatus includes: monitoring units attached to storage batteries connected in series and/or in parallel; and a management unit capable of wireless communication connection with the monitoring units. By using identification information of a specific monitoring unit included in a message broadcasted from the management unit to the monitoring units, communication between the management unit and the specific monitoring unit is established.

6 Claims, 7 Drawing Sheets

(56) References Cited

U.S. PATENT DOCUMENTS

| | | |
|---|---|---|
| 2013/0234721 A1 | 9/2013 | Nakamura et al. |
| 2013/0271072 A1 | 10/2013 | Lee et al. |
| 2014/0312913 A1 | 10/2014 | Kikuchi et al. |
| 2014/0347014 A1 | 11/2014 | Lee et al. |
| 2015/0154816 A1* | 6/2015 | Chen .................... G01R 31/343 |
| | | 701/29.1 |
| 2016/0233560 A1 | 8/2016 | Kanoh et al. |
| 2017/0343611 A1 | 11/2017 | Nakamura et al. |

FOREIGN PATENT DOCUMENTS

| | | |
|---|---|---|
| JP | 2013-085363 A | 5/2013 |
| JP | 2013-541320 A | 11/2013 |
| JP | WO2013/051156 A1 | 3/2015 |
| JP | WO 2016/147321 A1 | 9/2016 |
| JP | 6135767 B2 | 3/2017 |

* cited by examiner

System configuration

STORAGE BATTERY MONITORING APPARATUS AND STORAGE BATTERY MONITORING METHOD

TECHNICAL FIELD

The present invention relates to a storage battery monitoring apparatus and a storage battery monitoring method.

BACKGROUND ART

Patent Document 1 discloses that in an energy storage system, a relay board is communicably connected to an upper power control apparatus and each lower storage battery board.

PRIOR ART DOCUMENT

Patent Document

Patent Document 1: Japanese Patent No. 6135767

SUMMARY OF THE INVENTION

Problems to be Solved by the Invention

One aspect of the present invention provides a technique for monitoring a storage battery by using wireless communication.

Means for Solving the Problems

A storage battery monitoring apparatus according to one aspect of the present invention includes: monitoring units attached to storage batteries connected in series and/or in parallel; and a management unit capable of wireless communication connection with the monitoring units. By using identification information of a specific monitoring unit included in a message broadcasted from the management unit to the monitoring units, communication between the management unit and the specific monitoring unit is established.

A storage battery monitoring method according to another aspect of the present invention includes: monitoring storage batteries by using monitoring units attached to the storage batteries connected in series and/or in parallel; establishing communication between a management unit and a specific monitoring unit by using identification information of the specific monitoring unit included in a message broadcasted from the management unit to the monitoring units; and acquiring monitoring data by using the management unit.

Advantages of the Invention

A storage battery monitoring apparatus according to one aspect of the present invention can establish one-to-one wireless communication between a monitoring unit that monitors a specific storage battery included in a plurality of storage batteries and a management unit, to wirelessly acquire monitoring data from the specific storage battery. This makes it possible to realize the remote monitoring of the storage battery while reducing wiring cost.

MODE FOR CARRYING OUT THE INVENTION

Figure 1:
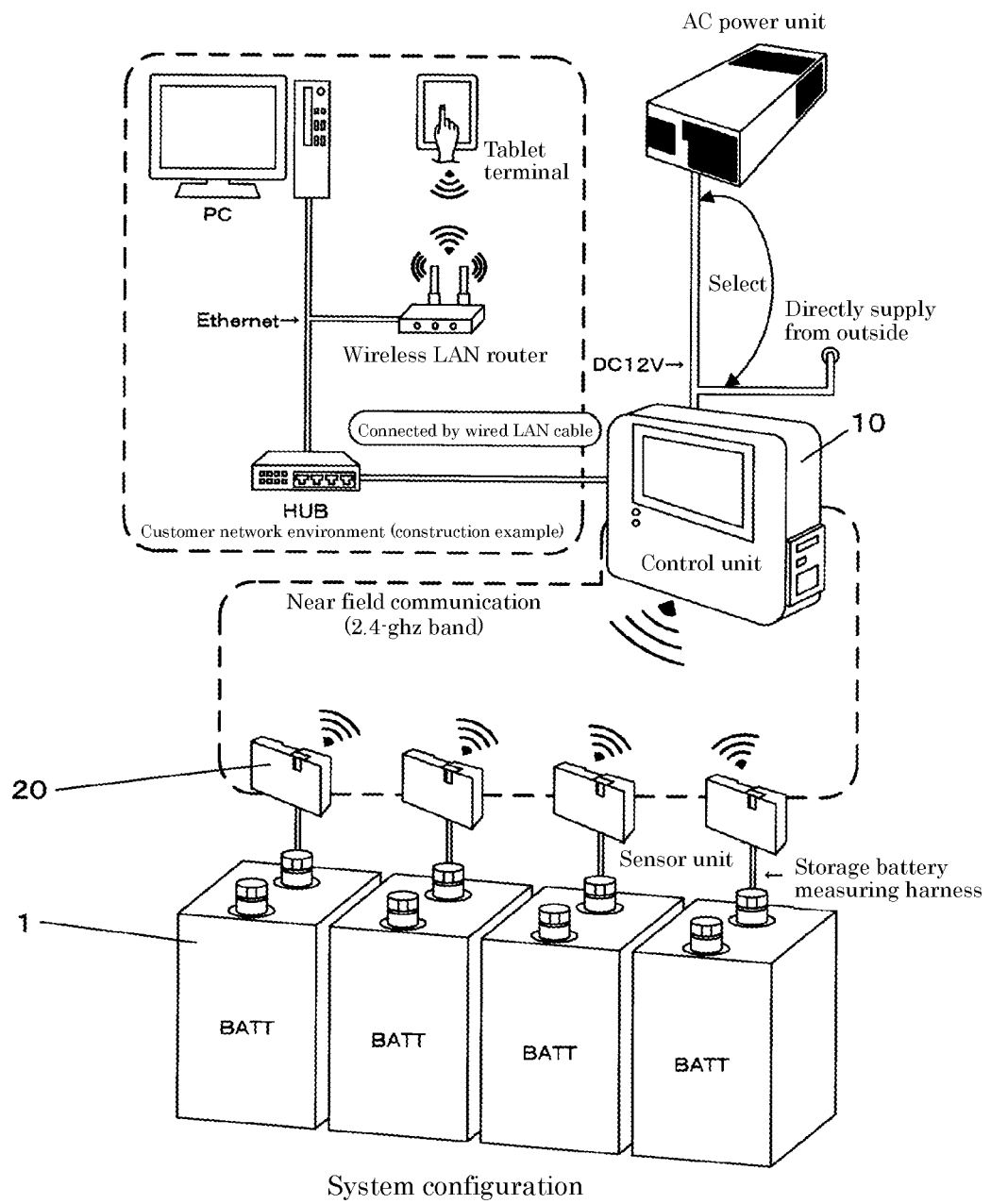
FIG. 1 is a diagram illustrating an outline of a storage battery monitoring apparatus.

In an energy storage system, a large number of storage batteries are connected in series and/or in parallel. There is also a large-scale energy storage system including several hundred storage batteries. There is a growing need for remote monitoring of individual storage batteries in the large-scale energy storage system. For realizing such storage battery monitoring, when monitoring units attached to the respective storage batteries and a management unit that acquires data from each of the monitoring units are connected by wire, network laying cost increases.

There is a demand for a technique capable of realizing remote monitoring of a storage battery while reducing wiring cost and communication cost.

Among near field communication standards, Bluetooth Low Energy (registered trademark) has attracted attention in Internet of Things (IoT) applications (hereinafter referred to as BLE). With BLE, wireless communication can be performed at low cost.

The present inventors have devised a concept in which a message broadcasted from a management unit to a plurality of monitoring units includes identification information of a specific monitoring unit, and the identification information is used to establish communication between the management unit and the specific monitoring unit.

With this communication method, even when a large number of monitoring units associated with a large number of storage batteries are provided, the management units can reliably acquire monitoring data sequentially from those monitoring units.

The monitoring units and the management unit may be installed on a same storage battery board.

Since wireless communication is used, the number of wirings is small. Thus, the storage battery monitoring apparatus can also be relatively easily attached to (post-installed on) an existing storage battery board.

The monitoring unit may wirelessly transmit, to the management unit, monitoring data including a voltage, an internal resistance, and a temperature of the storage battery to which the monitoring unit is connected.

With such a configuration, the state of health (SOH) of the storage battery can be monitored.

The management unit may have a web server function. The management unit may create screen data for screen display including an icon representing an overall state of the plurality of storage batteries.

With such a configuration, the storage battery can be remotely monitored by a web browser of a terminal device connected to the management unit. The icon representing the overall state of the plurality of storage batteries enables the grasping of the state of the energy storage system.

The management unit may sequentially transmit a message to each of the monitoring units, activate a specific monitoring unit with which communication has been established in response to a request for measurement and transmission of monitoring data transmitted from the management unit, measure monitoring data, and transmit the monitoring data. Each of the monitoring units intermittently determines whether to receive the message, and returns to a sleep state when not receiving the message including the identification information of the own unit.

With such a configuration, it is possible to save the time during the activation of the monitoring unit and reduce the power consumption during the activation as a whole, and to reduce the variation in the power consumption on the monitoring unit.

Hereinafter, an embodiment of a storage battery monitoring apparatus (lead-acid battery monitoring apparatus) will be described with reference to the drawings.

First Embodiment

A lead-acid battery monitoring apparatus illustrated in FIG. 1 includes: sensor units (monitoring units) 20 attached respectively to lead-acid batteries 1 connected in series and/or in parallel; and a control unit (management unit) 10 capable of wireless communication connection with the plurality of sensor units 20.

Here, the plurality of lead-acid batteries 1 connected in series may be referred to as a bank, and a plurality of banks connected in parallel may be referred to as a domain as a monitoring target unit.

The control unit 10 and the plurality of sensor units 20 are installed in a storage battery board that stores a plurality of lead-acid batteries to be monitored. For example, the control unit 10 is attached to the inside of an openable lid of the storage battery board. The sensor units 20 are installed on the lead-acid batteries 1 arranged in the storage battery board.

The control unit 10 has a web server function and may receive access by a network-connected terminal device such as a computer (PC) or a tablet.

Figure 2:
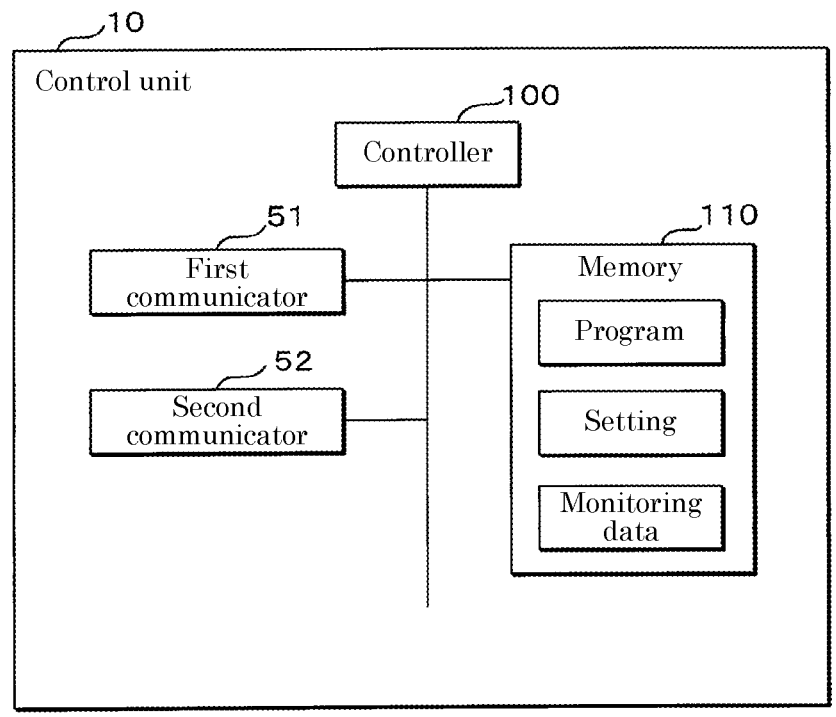
FIG. 2 is a block diagram illustrating a configuration of a control unit.

FIG. 2 is a block diagram illustrating a configuration of the control unit 10. The control unit 10 includes a controller 100, a memory 110, a first communicator 51, and a second communicator 52.

The controller 100 includes a processor and controls the first communicator 51 and the second communicator 52 on the basis of a program stored in the memory 110.

The memory 110 uses a nonvolatile memory. The storage unit 110 stores a program in advance. The storage unit 110 stores contents set by an operation on a menu screen to be described later. The memory 110 stores storage battery information acquired by the controller 100.

The first communicator 51 is a wireless communication module that realizes wireless communication connection with the sensor unit 20. The control unit 10 is communicably connected to the plurality of sensor units 20 by the first communicator 51. The first communicator 51 realizes communication by BLE.

The second communicator 52 is a connection module for connecting to a customer's network illustrated in FIG. 1 and is, for example, a network card corresponding to a wired local area network (LAN). The second communicator 52 is a communication module that enables communication connection with a network-connected computer (PC) or tablet terminal. The second communicator 52 is a communication device compatible with a wired LAN, a wireless LAN, or a universal serial bus (USB) and may be able to communicate with a computer or a tablet terminal of a person in charge of maintenance without going through a customer's network.

Figure 3:
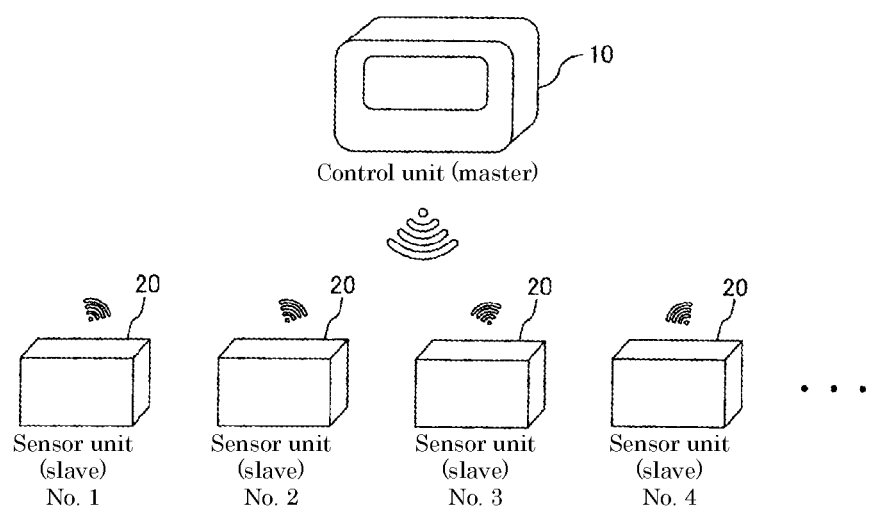
FIG. 3 is a schematic diagram illustrating communication between the control unit and sensor units.

FIG. 3 is a schematic diagram illustrating communication between the control unit 10 and the sensor units 20. A message broadcasted from the control unit 10 to the plurality of sensor units 20 includes identification information of a specific sensor unit 20.

The message may include a media access control (MAC) address storage and a message body. The identification information of the specific sensor unit 20 may be stored in the MAC address storage.

Figure 4:
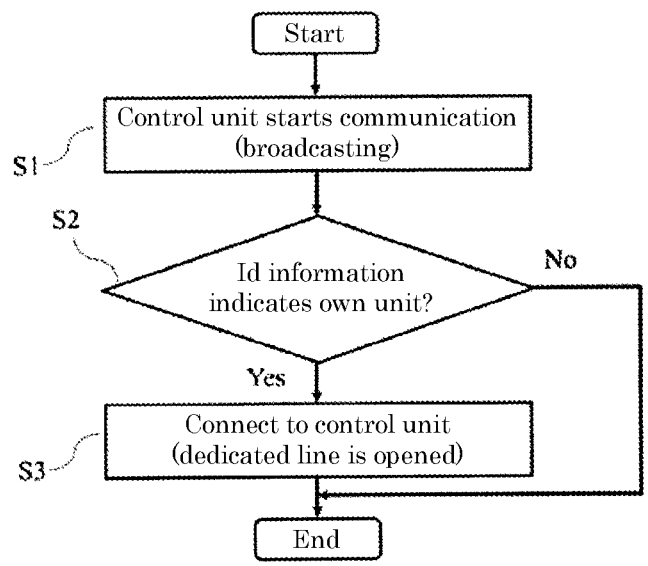
FIG. 4 is a flowchart illustrating a procedure of communication establishment.

FIG. 4 is a flowchart illustrating a procedure of communication establishment. First, the control unit 10 starts the entire communication (broadcasting) (S1). The message broadcasted from the control unit 10 to the plurality of sensor units 20 includes the identification information (e.g., No. 2) of the specific sensor unit 20. The identification information may be written in the MAC address storage of the broadcasted message, and at that time, there may be no information in the message body (the message body may be empty).

Each of the plurality of sensor units 20 determines whether the identification information included in the message matches that of the own unit (S2). For example, the sensor unit 20 of No. 1 illustrated in FIG. 3 ignores the message from the control unit 10 (does nothing). Then, only the sensor unit 20 of No. 2 is connected to the control unit 10. In other words, a dedicated line between the sensor unit 20 of No. 2 and the control unit 10 is opened (FIG. 4, S3).

Thereafter, the sensor unit 20 of No. 2 transmits the monitoring data of the voltage, the internal resistance, and the temperature of the lead-acid battery 1, to which the sensor unit is attached, to the control unit 10 through the dedicated line.

After acquiring the monitoring data from the sensor unit 20 of No. 2, the control unit 10 returns to S1 of FIG. 4 and broadcasts a message including identification information of another sensor unit (e.g., No. 3).

The control unit 10 has a web server function and creates screen data for screen display that includes icons representing the overall state of the plurality of lead-acid batteries 1.

Figure 5:
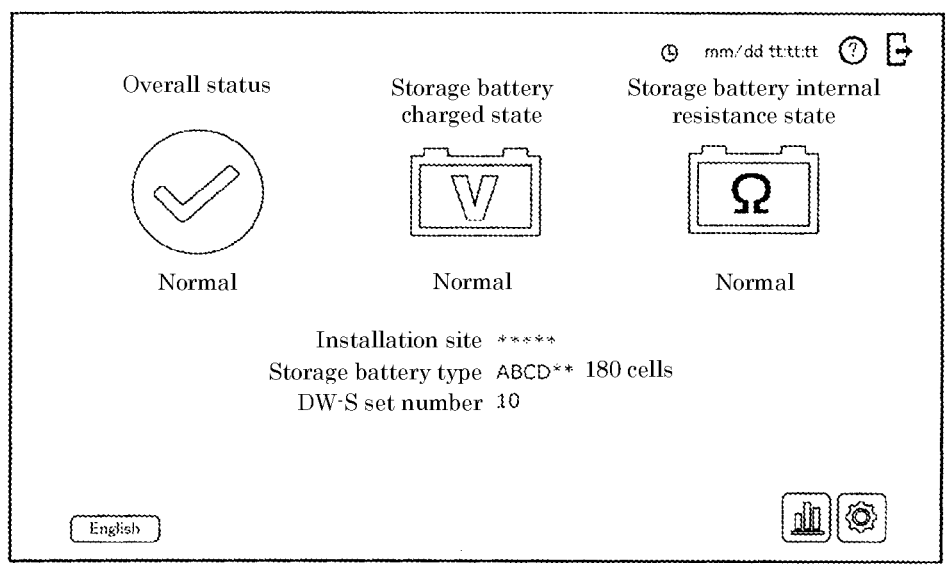
FIG. 5 is a diagram illustrating a remote monitoring screen on a web browser.

FIG. 5 illustrates an example of a remote monitoring screen displayed on the web browser terminal device, which is network-connected to the control unit 10. The remote monitoring screen includes an icon for the overall status, an icon for a storage battery voltage state, and an icon for a storage battery internal resistance state.

In addition to an icon indicating "normal", an icon indicating "caution" or an icon indicating "warning" may be prepared as the icon for the overall status. Similarly, icons indicating "caution" and "warning" may be prepared for the icon for the storage battery voltage state and the icon for the storage battery internal resistance state.

In the lead-acid battery monitoring apparatus described above, the identification information of the specific sensor unit 20 is included in the message broadcasted from the control unit 10 to the plurality of sensor units 20, and communication between the control unit 10 and the specific sensor unit 20 is established using the identification information.

Therefore, even when several hundreds of sensor units 20 associated with several hundreds of lead-acid batteries 1 are provided as in an energy storage system having a storage battery group including a plurality of banks, the control unit 10 can reliably acquire monitoring data sequentially from the sensor units 20.

In the lead-acid battery monitoring apparatus, the sensor units 20 and the control unit 10 are installed on the same storage battery board. Thus, this lead-acid battery monitoring apparatus can also be relatively easily attached to (post-installed on) an existing storage battery board not provided with the monitoring apparatus.

The sensor unit 20 wirelessly transmits the monitoring data of the voltage, internal resistance, and temperature of the lead-acid battery 1 to which the sensor unit 20 is connected to the control unit 10. Hence, the state of health (SOH) of the lead-acid battery 1 can be monitored.

The control unit 10 has a web server function and creates screen data for screen display that includes icons representing the overall state of the plurality of lead-acid batteries 1. The overall state may be determined by comparing the monitoring data (numerical data) of the plurality of lead-acid batteries 1 with a threshold value or performing statistical processing.

The lead-acid battery 1 can be remotely monitored by a web browser of a terminal device connected to the control unit 10 by LAN. The icon representing the overall state of the plurality of lead-acid batteries 1 facilitates the grasping of the state of the energy storage system.

In BLE, three channels out of forty channels are used for broadcasting. After the communication between the specific sensor unit 20 and the control unit 10 is established, and the dedicated line is opened, the remaining channels may be used.

Second Embodiment

The hardware configuration of a lead-acid battery monitoring apparatus according to a second embodiment is similar to that of the first embodiment, and hence the same reference numerals are given to common configurations, and a detailed description thereof will be omitted. In the second embodiment, communication between the control unit 10 and the sensor unit 20 is similar to that in the first embodiment in the use of BLE but is different in a communication processing procedure.

Figure 6:
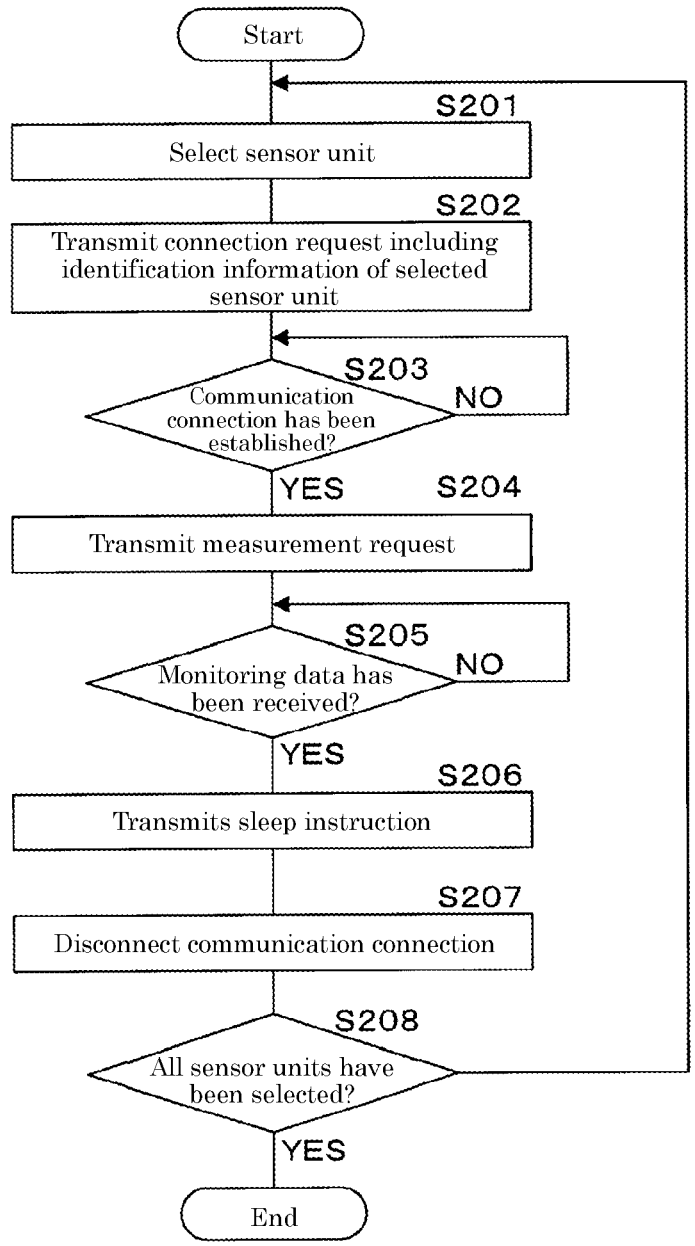
FIG. 6 is a flowchart illustrating an example of a processing procedure in the control unit.

FIG. 6 is a flowchart illustrating an example of a processing procedure in the control unit 10. The control unit 10 executes the following processing in units of banks at a predetermined timing (e.g., once a day). The control unit 10 sequentially executes processing for all the banks. The control unit 10 stores, in a built-in memory, the timing for executing the following processing and the identification information of the sensor units 20 to be connected.

The control unit 10 selects one piece of identification information of the sensor unit 20 (step S201). The control unit 10 transmits a connection request message including the selected identification information by BLE (step S202) and determines whether a communication connection (pairing) with the sensor unit 20 of the selected identification information has been established (step S203).

When determining in step S203 that the communication connection is established (S203: YES), the control unit 10 transmits a measurement request to the communicably connected sensor unit 20 (step S204) and determines whether or not the monitoring data obtained by the measurement in accordance with the measurement request has been received (step S205).

When determining that the monitoring data has been received (S205: YES), the control unit 10 transmits a sleep instruction to the communicably connected sensor unit 20 (step S206), disconnects the communication connection (step S207), and proceeds the processing to the next step S208.

The control unit 10 determines whether or not the identification information of each of all the sensor units 20 included in the target bank has been selected (step S208). When determining that all has not been selected (S208: NO), the control unit 10 returns the processing to step S201 and selects identification information of the next sensor unit 20.

When determining that all has been selected (S208: YES), the control unit 10 ends the processing for the bank at a predetermined timing.

When determining in step S203 that the communication connection has not been established (S203: NO), the control unit 10 returns the processing to step S203 and stands by. The control unit 10 makes an attempt a predetermined number of times in a predetermined standby time, and when having not been able to establish communication, the control unit 10 proceeds the processing to step S207.

When determining in step S205 that the monitoring data cannot be received (S205: NO), the control unit 10 returns the processing to step S205 and stands by. The control unit 10 makes an attempt a predetermined number of times in a predetermined standby time, and when having not been able to receive the data, the control unit 10 proceeds the processing to step S207.

Figure 7:
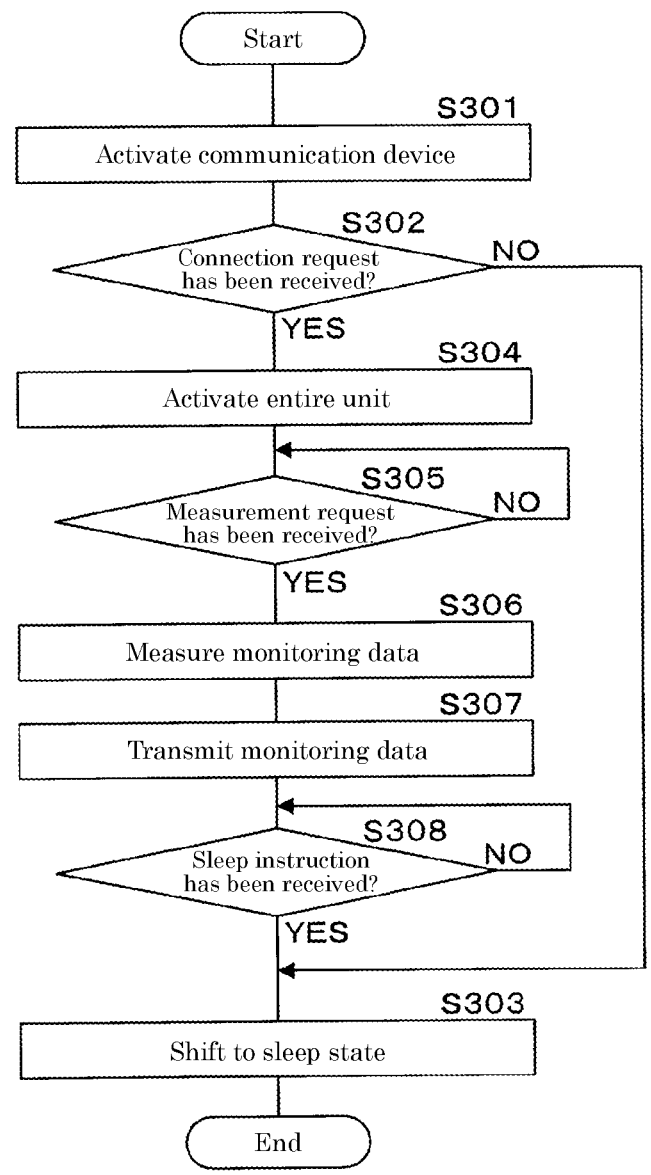
FIG. 7 is a flowchart illustrating an example of a processing procedure in the sensor unit.

FIG. 7 is a flowchart illustrating an example of a processing procedure in the sensor unit 20. The sensor unit 20 intermittently activates a BLE communication device from the sleep state, for example, every two or three seconds (step S301) and determines whether or not a connection request to itself has been received (step S302).

When determining that the connection request has not been received (S302: NO), the sensor unit 20 shifts to the sleep state again (step S303) and ends the processing.

When determining in step S302 that the connection request has been received (S302: YES), the sensor unit 20 activates the entire sensor unit (step S304) and determines whether or not a measurement request has been received (step S305). When determining that the measurement request has been received (S305: YES), the sensor unit 20 measures the monitoring data of the voltage, the internal resistance, and the temperature in the lead-acid battery to which the own unit is attached (step S306). The sensor unit 20 transmits the monitoring data obtained by the measurement to the control unit 10 as a response to the measurement request (step S307).

The sensor unit 20 determines whether or not a sleep instruction has been received (step S308), and when determining that the sleep instruction has been received, the sensor unit 20 shifts to the sleep state (step S303) and ends the processing.

When determining in step S305 that the measurement request has not been received (S305: NO), the sensor unit 20 returns the processing to step S305 and stands by. The sensor unit 20 makes an attempt a predetermined number of times in a predetermined standby time, and when having not been able to receive the measurement request, the sensor unit 20 proceeds the processing to step S303.

When determining in step S308 that the sleep instruction has not been received (S308: NO), the sensor unit 20 returns the processing to step S308 and stands by. The sensor unit 20 makes an attempt a predetermined number of times in a predetermined standby time, and when having not been able to receive the sleep instruction, the sensor unit 20 proceeds the processing to step S303.

Figure 8:
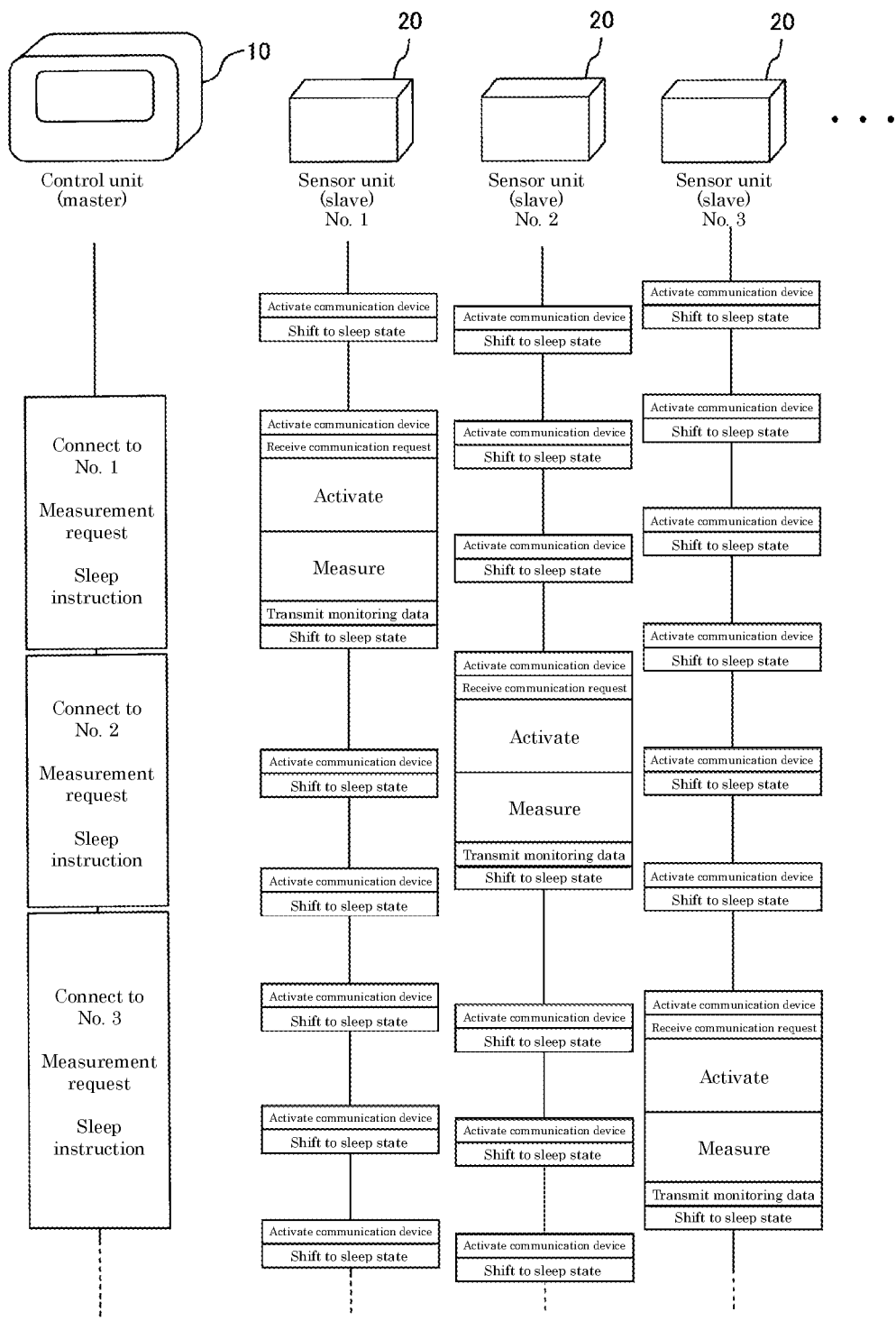
FIG. 8 is a schematic diagram illustrating a communication procedure according to a second embodiment.
Figure 9:
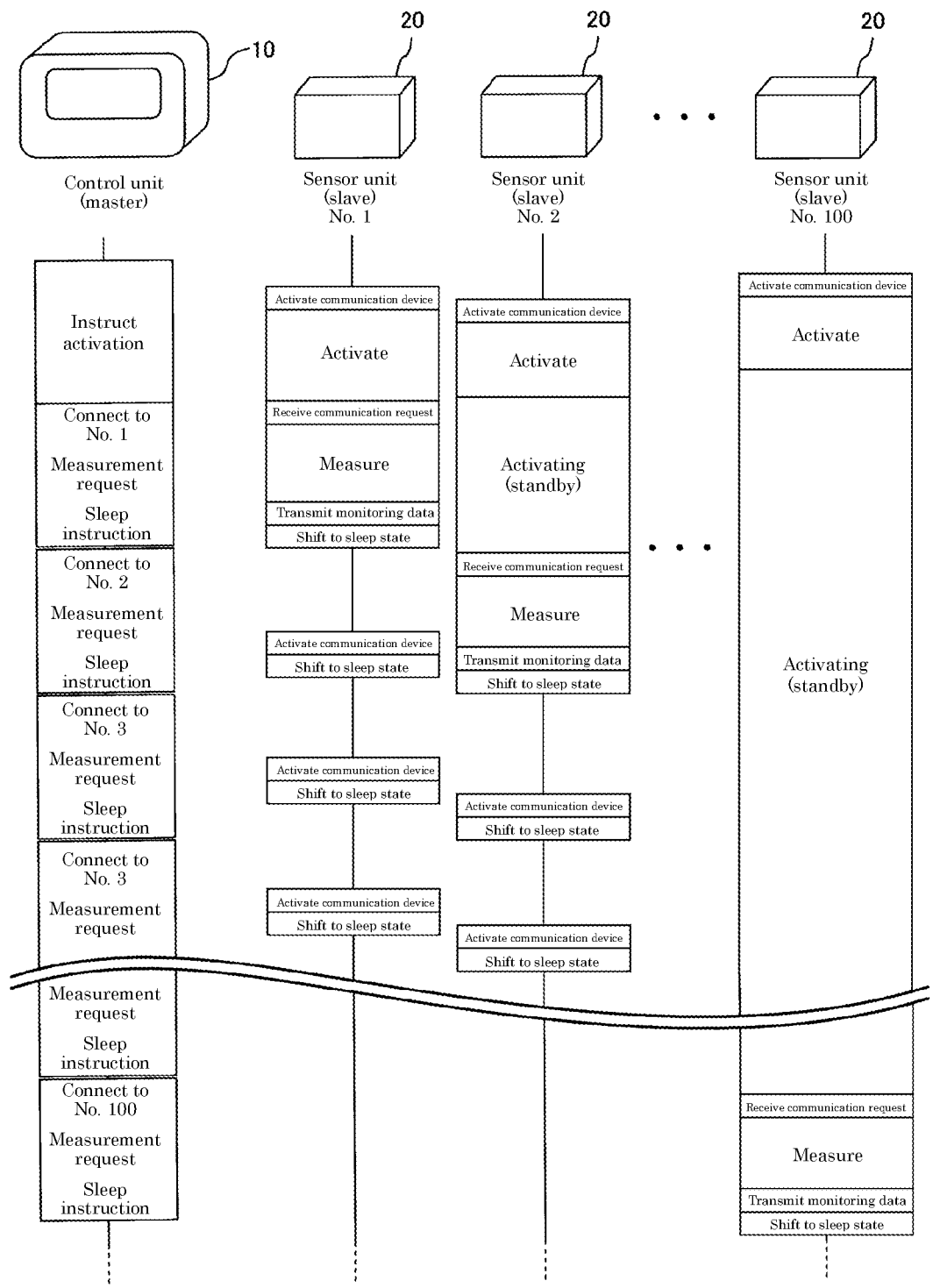
FIG. 9 is a schematic diagram illustrating a communication procedure in a comparative example.

FIG. 8 is a schematic diagram illustrating a communication procedure according to the second embodiment. FIG. 7 illustrates an activation time in the sensor units 20 by the control unit 10 executing the procedure illustrated in the flowchart of FIG. 6 and the sensor units 20 executing the procedure illustrated in the flowchart of FIG. 7. As illustrated in FIG. 8, the sensor unit 20 intermittently determines whether a connection request has been received by the communication device of BLE and is activated only when the connection request has been received. FIG. 9 is a schematic diagram illustrating a communication procedure in a comparative example. FIG. 9 illustrates an activation time of the sensor unit 20 when the control unit 10 activates a plurality of sensor units 20 at a time as a comparative example. As illustrated in FIG. 9, in the comparative example, the sensor units 20 quickly respond to the measurement request from the control unit 10 since being activated at once. However, in the situation where a large number of sensor units 20 are connected, a standby state from activation to actual measurement and response becomes long, and power consumption increases.

As illustrated in FIGS. 8 and 9, one-to-one BLE communication is sequentially established from the control unit 10 to the sensor unit 20, measurement is executed, and monitoring data obtained as a result of the measurement is received. It is thereby possible to reduce the time when the sensor unit 20 is in the standby state while being activated, reduce the power consumption during the activation as a whole, and reduce the variation in the power consumption on the sensor unit 20.

The control unit 10 may be provided with a plurality of first communicators 51 that realize communication with the sensor unit 20 so that communication connection with different sensor units 20 can be performed simultaneously. For example, the processing procedures illustrated in FIGS. 6 to 8 may be executed simultaneously for banks connected in parallel.

The above-described embodiments are examples, and the present invention is not limited thereto. The communication standard of the wireless communication to be used is not limited to BLE. The storage battery is not limited to the lead-acid battery but may be a lithium ion battery or another secondary battery.

DESCRIPTION OF REFERENCE SIGNS

1: lead-acid battery
10: control unit (management unit)
20: sensor unit (monitoring unit)

The invention claimed is:

1. A storage battery monitoring apparatus comprising:
monitoring units attached to storage batteries connected in series and/or in parallel; and
a management unit capable of wireless communication connection with the monitoring units,
wherein by using identification information of a specific monitoring unit included in a message broadcasted from the management unit to the monitoring units, communication between the management unit and the specific monitoring unit is established,
the management unit
sequentially selects identification information of the monitoring units stored in advance,
transmits the message including the identification information of the selected monitoring unit, and
transmits a request for measurement and transmission of monitoring data to the monitoring unit with which the communication is established, and
each of the monitoring units
intermittently determines whether or not a message including identification information of the own unit is received,
activates the own unit when receiving the message,
measures monitoring data of the storage battery to which the monitoring unit is connected, and
wirelessly transmits the measured monitoring data to the management unit and shifts to a sleep state when not receiving the message.

2. The storage battery monitoring apparatus according to claim 1, wherein the monitoring units and the management unit are installed on a same storage battery board.

3. The storage battery monitoring apparatus according to claim 1, wherein the monitoring unit wirelessly transmits, to the management unit, monitoring data including a voltage, an internal resistance, and a temperature of the storage battery to which the monitoring unit is connected.

4. The storage battery monitoring apparatus according to claim 1, wherein the management unit has a web server function.

5. The storage battery monitoring apparatus according to claim 4, wherein the management unit creates screen data for screen display including an icon representing an overall state of the plurality of storage batteries.

6. A storage battery monitoring method comprising:
monitoring storage batteries by using monitoring units attached to the storage batteries connected in series and/or in parallel;
establishing communication between a management unit and a specific monitoring unit by using identification information of the specific monitoring unit included in a message broadcasted from the management unit to the monitoring units; and
acquiring monitoring data by using the management unit,
wherein the management unit
sequentially selects identification information of the monitoring units stored in advance,
transmits the message including the identification information of the selected monitoring unit, and
transmits a request for measurement and transmission of monitoring data to the monitoring unit with which the communication is established, and
each of the monitoring units
intermittently determines whether or not a message including identification information of the own unit is received,
activates the own unit when receiving the message, measures monitoring data of the storage battery to which the monitoring unit is connected, and
wirelessly transmits the measured monitoring data to the management unit and shifts to a sleep state when not receiving the message.

* * * * *